(12) United States Patent
Yin et al.

(10) Patent No.: US 8,409,941 B2
(45) Date of Patent: Apr. 2, 2013

(54) SEMICONDUCTOR DEVICE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 290 days.

(21) Appl. No.: 12/841,406

(22) Filed: Jul. 22, 2010

(65) Prior Publication Data
US 2011/0062502 A1 Mar. 17, 2011

(30) Foreign Application Priority Data

Sep. 16, 2009 (CN) .......................... 2009 1 0092514

(51) Int. Cl.
*H01L 21/338* (2006.01)
(52) U.S. Cl. ........ 438/183; 438/618; 438/626; 438/631; 438/926; 257/E21.453
(58) Field of Classification Search .................. 438/618, 438/183, 626, 631, 926; 257/E21.453
See application file for complete search history.

(56) References Cited

U.S. PATENT DOCUMENTS

| 6,579,784 | B1 | 6/2003 | Huang | |
|---|---|---|---|---|
| 7,544,601 | B2 | 6/2009 | Hong | |
| 2003/0127678 | A1 | 7/2003 | Shimizu et al. | |
| 2007/0099414 | A1* | 5/2007 | Frohberg et al. | 438/618 |
| 2007/0128847 | A1* | 6/2007 | Hong | 438/624 |
| 2007/0257323 | A1 | 11/2007 | Tsui et al. | |

FOREIGN PATENT DOCUMENTS

| CN | 1431710 A | 7/2003 |
|---|---|---|
| CN | 1967845 A | 5/2007 |
| CN | 101068018 A | 11/2007 |

OTHER PUBLICATIONS

"International Application Serial No. PCT/CN2010/000836, International Search Report mailed Sep. 16, 2009", 5 pgs.
"International Application Serial No. PCT/CN2010/000836, Written Opinion mailed Sep. 16, 2009", 5 pgs.

* cited by examiner

*Primary Examiner* — Long Tran
(74) *Attorney, Agent, or Firm* — Schwegman Lundberg & Woessner, P.A.

(57) ABSTRACT

The present invention proposes a method of forming a dual contact plug, comprising steps of: forming a source/drain region and a sacrificed gate structure on a semiconductor substrate, the sacrificed gate structure including a sacrificed gate; depositing a first inter-layer dielectric layer; planarizing the first inter-layer dielectric layer to expose the sacrificed gate in the sacrificed gate structure; removing the sacrificed gate and depositing to form a metal gate; etching to form a first source/drain contact opening in the first inter-layer dielectric layer; sequentially depositing a liner and filling conductive metal in the first source/drain contact opening to form a first source/drain contact plug; depositing a second inter-layer dielectric layer on the first inter-layer dielectric layer; etching to form a second source/drain contact opening and a gate contact opening in the second inter-layer dielectric layer; and sequentially depositing a liner and filling conductive metal in the second source/drain contact opening and the gate contact opening to form a second source/drain contact plug and a gate contact plug. The present invention also proposes a semiconductor device manufactured by the above process.

10 Claims, 6 Drawing Sheets

SEMICONDUCTOR DEVICE AND METHOD FOR MANUFACTURING THE SAME

PRIORITY APPLICATION(S)

This patent application claims the benefit of priority, under 35 U.S.C. §120, to PCT Patent Application Number PCT/CN2010/000836; which patent application claims the benefit of priority, under 35 U.S.C. §119, to Chinese Patent Application Serial Number 200910092514.3, filed Sep. 16, 2009, the entire contents of which are incorporated herein by reference in their entirety.

BACKGROUND OF THE INVENTION

1. Field of Invention

The present invention relates to semiconductor field, especially to semiconductor devices and manufacturing methods thereof, and more particularly, to a method of forming a dual contact plug for replacement gate and a semiconductor device manufactured by means of the method.

2. Description of Prior Art

With the increasingly smaller size of semiconductor device, inter-layer contacts and contact plugs (CA) must become smaller, and distances therebetween also become shorter and shorter. Fabricating increasingly smaller contacts and contact plugs by using conventional processes presents a number of problems. (1) As an etching depth on gate is different from that in source/drain regions, shorts may likely occur between a contact plug and the gate. (2) As an etching depth in the source/drain regions is large whereas a size of openings thereof is small (i.e., it has a small width/height ratio), a number of process defects such as underetch, cavities in metal-filling plugs, and so on may be caused. Thus, the selection of processes is restricted, and the parasitic resistance increases.

Figure 1:
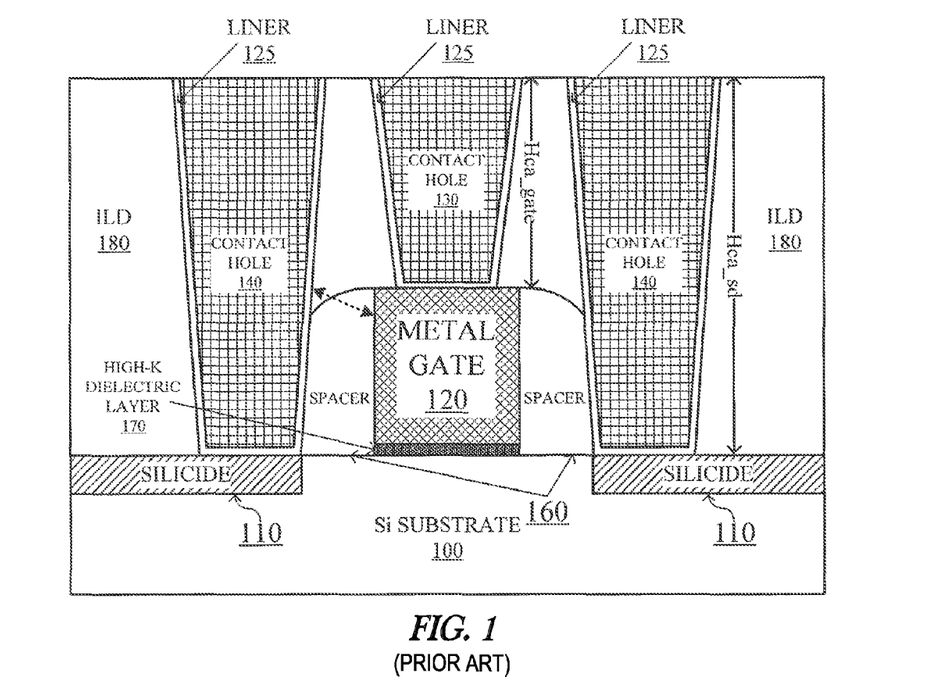
FIG. 1 is a schematic diagram of a semiconductor device manufactured according to the conventional process.

Hereunder, by referring to FIG. 1, the problems in the conventional processes will be described in details. FIG. 1 is a schematic diagram of a semiconductor device manufactured according to the conventional process. As shown in FIG. 1, the semiconductor device manufactured according to the conventional process mainly comprises: a Si substrate 100, an Inter-Layer Dielectric (ILD) layer 180, silicide regions 110, a metal gate 120, source/drain contact plugs 140, and a gate contact plug 130. The metal gate 120 is formed on a high-k dielectric layer 170 which is deposited on the Si substrate 100. A spacer 160 is formed to surround the high-k dielectric layer 170 and the metal gate 120. The inter-layer dielectric layer 180 is deposited on the Si substrate 100. The silicide regions 110 is formed on and embedded in the Si substrate 100. The source/drain contact plugs 140 and the gate contact plug 130 are formed in the inter-layer dielectric layer 180, in which the source/drain contact plugs 140 are in contact with the silicide regions 110 respectively and the gate contact plug 130 is in contact with the metal gate 120. Each of the source/drain contact plugs 140 and the gate contact plug 130 includes a liner 125 and conductive metal filled therein. As illustrated in FIG. 1, the etching depth Hca_gate of the etching process for forming the gate contact plug 130 is different from the etching depth Hca_sd of the etching process for forming the source/drain contact plugs 140; the source/drain contact plugs 140 have a smaller width/height ratio, so in forming the source/drain contact plugs 140, the number of process defects such as underetch, cavities in metal-filling plugs, and so on may exist therein more likely. Moreover, since the etching process for the source/drain contact plugs 140 has much stricter requirements, shorts between the source/drain contact plugs 140 and the metal gate 120 (denoted by the dashed line in FIG. 1) may be resulted in with a greater possibility.

SUMMARY OF THE INVENTION

In view of the above drawbacks of the conventional processes, the present invention proposes a method of forming a dual contact plug for replacement gate such that source/drain contact plugs and gate contact plug having the same depth are formed on the source/drain regions and the gate region, so the shorts between the source/drain contact plugs and the gate are avoided, and at the same time, the processes defects are prevented. Additionally, the present invention is compatible with the replacement gate process.

According to the first aspect of the present invention, there is provided a method of forming a dual contact plug comprising steps of: forming a source/drain region and a sacrificed gate structure on a semiconductor substrate, the sacrificed gate structure including a sacrificed gate; depositing a first inter-layer dielectric layer; planarizing the first inter-layer dielectric layer to expose the sacrificed gate in the sacrificed gate structure; removing the sacrificed gate and depositing to form a metal gate by means of replacement gate process; etching to form a first source/drain contact opening in the first inter-layer dielectric layer by means of lithography so that the source/drain region formed on the semiconductor substrate is exposed at the bottom of the first source/drain contact opening; sequentially depositing a liner and filling conductive metal in the first source/drain contact opening to form a first source/drain contact plug; depositing a second inter-layer dielectric layer on the first inter-layer dielectric layer with the first source/drain contact plug formed therein; etching to form a second source/drain contact opening and a gate contact opening in the second inter-layer dielectric layer by means of lithography so that the first source/drain contact plug is exposed at the bottom of the second source/drain contact opening and the metal gate is exposed at the bottom of the gate contact opening; and sequentially depositing a liner and filling conductive metal in the second source/drain contact opening and the gate contact opening to form a second source/drain contact plug and a gate contact plug.

Preferably, the first source/drain contact plug is narrower than the second source/drain contact plug and the gate contact plug. More preferably, the width of the first source/drain contact plug is 15-100 nm, the width of the second source/drain contact plug is 20-150 nm, and the width of the gate contact plug is 20-150 nm.

Preferably, the conductive metal in the second source/drain contact plug and the gate contact plug has a resistivity smaller than that of the conductive metal in the first source/drain contact plug.

Preferably, the first inter-layer dielectric layer includes at least one selected from undoped silicon oxide ($SiO_2$), doped silicon oxide (e.g., Boro-Silicate Glass (BSG) and Boro-Phospho-Silicate Glass (BPSG)) and silicon nitride ($Si_3N_4$), and the second inter-layer dielectric layer includes at least one selected from undoped silicon oxide ($SiO_2$), doped silicon oxide (e.g., BSG and BPSG) and silicon nitride ($Si_3N_4$).

Preferably, the method further comprises a step of: forming a barrier liner entirely on the semiconductor substrate with the source/drain region and the sacrificed gate structure formed thereon, before depositing the first inter-layer dielectric layer. Herein, the barrier liner includes $Si_3N_4$ and has a thickness of 10-50 nm.

Preferably, the method further comprises a step of: forming a barrier layer entirely on the first inter-layer dielectric layer with the first source/drain contact plug formed therein, before depositing the second inter-layer dielectric layer. Herein, the barrier layer includes $Si_3N_4$ and has a thickness of 10-50 nm.

Preferably, the liner includes at least one selected from TiN, TaN, Ta and Ti, and the conductive metal includes at least one selected from Ti, Al, TiAl, Cu and W.

Preferably, the thickness of the first inter-layer dielectric layer is 15-50 nm, and the thickness of the second inter-layer dielectric layer is 25-90 nm.

According to a second aspect of the present invention, there is provided a semiconductor device comprising: a semiconductor substrate having a source/drain region and a gate structure formed thereon, the gate structure including a metal gate; a first inter-layer dielectric layer deposited on the semiconductor substrate and having a first source/drain contact plug formed therein, the first source/drain contact plug being in contact with the source/drain region; and a second inter-layer dielectric layer deposited on the first inter-layer dielectric layer and having a second source/drain contact plug and a gate contact plug formed therein, the second source/drain contact plug being in contact with the first source/drain contact plug, and the gate contact plug being in contact with the metal gate.

Preferably, the second source/drain contact plug and the gate contact plug have the same depth.

Preferably, each of the first source/drain contact plug, the second source/drain contact plug and the gate contact plug includes a liner and conductive metal filled therein. More preferably, the conductive metal in the second source/drain contact plug and the gate contact plug has a resistivity smaller than that of the conductive metal in the first source/drain contact plug. More preferably, the liner includes at least one selected from TiN, TaN, Ta and Ti, and the conductive metal includes at least one selected from Ti, Al, TiAl, Cu and W.

Preferably, the first source/drain contact plug is narrower than the second source/drain contact plug and the gate contact plug. More preferably, the width of the first source/drain contact plug is 15-100 nm, the width of the second source/drain contact plug is 20-150 nm, and the width of the gate contact plug is 20-150 nm.

Preferably, the first inter-layer dielectric layer includes at least one selected from undoped silicon oxide ($SiO_2$), doped silicon oxide (e.g., Boro-Silicate Glass (BSG) and Boro-Phospho-Silicate Glass (BPSG)) and silicon nitride ($Si_3N_4$), and the second inter-layer dielectric layer includes at least one selected from undoped silicon oxide ($SiO_2$), doped silicon oxide (e.g., BSG and BPSG) and silicon nitride ($Si_3N_4$).

Preferably, the semiconductor device further comprises: a barrier liner formed between the first inter-layer dielectric layer and the semiconductor substrate. Herein, the barrier liner includes $Si_3N_4$ and has a thickness of 10-50 nm.

Preferably, the semiconductor device further comprises: a barrier layer formed between the first inter-layer dielectric layer and the second inter-layer dielectric layer. Herein, the barrier layer includes $Si_3N_4$ and has a thickness of 10-50 nm.

Preferably, the thickness of the first inter-layer dielectric layer is 15-50 nm, and the thickness of the second inter-layer dielectric layer is 25-90 nm.

In accordance with the present invention, the second source/drain contact plug and the gate contact plug have the same etching depth. Thus, it is possible to effectively reduce the possibilities of shorts occurring between the contact plug and the gate. Moreover, since the etching width/height ratio of the source/drain contact plug and that of the gate contact plug are close to each other, the requirements on etching and the contact plug filling processes are relaxed. At the same time, the possibility of the occurrence of process defects is also reduced. Additionally, the present invention involves the replacement gate process which is compatible with the typical replacement gate procedures.

BRIEF DESCRIPTION OF THE DRAWINGS

The above and other objects, features and advantages of the present invention will be clearer from the following detailed description about the non-limited embodiments of the present invention taken in conjunction with the accompanied drawings, in which:

FIGS. 2-14 are schematic diagrams showing the respective steps of the semiconductor device manufacturing method proposed by the present invention, in which

It is noted that the drawings of the present invention are not to scale but only for the purpose of illustrations. Therefore, the drawings should not be construed as any limitations or restrictions on the scope of the present invention. In the drawings, like constituting components are represented by like reference numbers.

DETAILED DESCRIPTION OF PREFERRED EMBODIMENTS

Hereunder, the present invention will be described in accordance with the drawings. In the following description, while it may blur the understanding of the present invention, the conventional structure or construction will be omitted.

Figure 14:
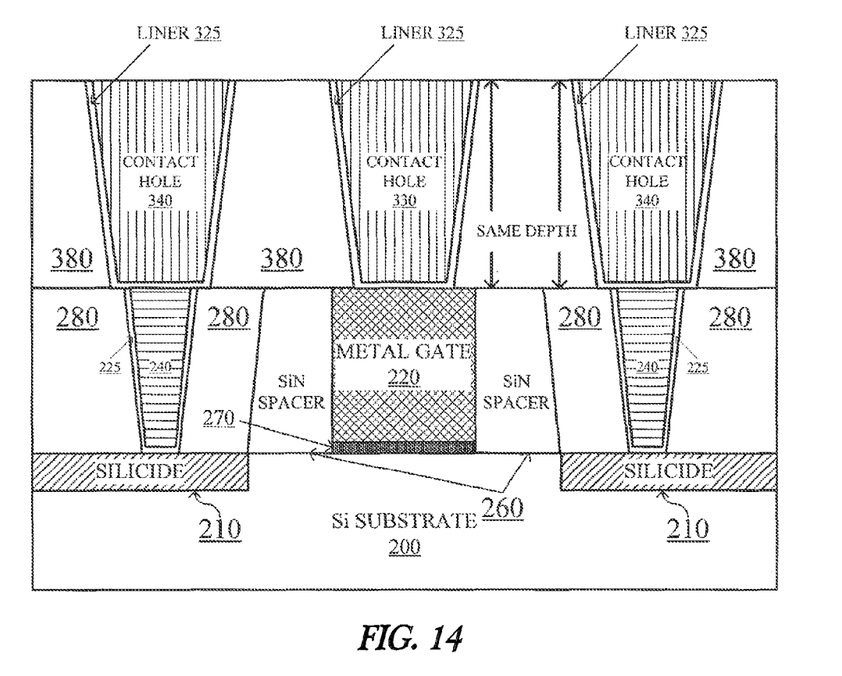
FIG. 14 illustrates a semiconductor device manufactured according to the semiconductor device manufacturing method proposed by the present invention.

First of all, by referring to FIG. 14, the semiconductor device manufactured by the inventive process will be described in details. FIG. 14 is a schematic diagram showing a semiconductor device manufactured according to the semiconductor device manufacturing method proposed by the present invention.

As shown in FIG. 14, the semiconductor device manufactured by the inventive process mainly comprises: a Si substrate 200, a first Inter-Layer Dielectric (ILD) layer 280 (having a thickness of 15-50 nm), a second Inter-Layer Dielectric (ILD) layer 380 (having a thickness of 25-90 nm), silicide regions 210, a metal gate 220, a first source/drain contact plugs 240 (having a width of 15-100 nm), a second source/drain contact plugs 340 (having a width of 20-150 nm), and a gate contact plug 330 (having a width of 20-150 nm). The metal gate 220 is formed on a high-k dielectric layer 270 (having a thickness of 1-3 nm) which is deposited on the Si substrate 200. A SiN spacer 260 (having a width of 10-40 nm) is formed to surround the high-k dielectric layer 270 and the metal gate 220. The first inter-layer dielectric layer 280 is deposited on the Si substrate 200. The second inter-layer dielectric layer 380 is deposited on the first inter-layer dielectric layer 280. The silicide regions 210 is formed on and embedded in the Si substrate 200. The first source/drain contact plugs 240 are formed in the first inter-layer dielectric layer 280 and are in contact with the silicide regions 210 respectively. The second source/drain contact plugs 340 and the gate contact plug 330 are formed in the second inter-layer dielectric layer 380, in which the second source/drain contact plugs 340 are in contact with the first source/drain contact plugs 240 respectively and the gate contact plug 330 is in contact with the metal gate 220. Each of the first source/drain contact plugs 240 includes a liner 225 (having a thickness of 2-15 nm) and conductive metal filled therein, and each of the second source/drain contact plugs 340 and the gate contact plug 330 includes a liner 325 (having a thickness of 2-15 nm) and conductive metal filled therein.

In accordance with the present invention, the second source/drain contact plugs 340 and the gate contact plug 330 have the same etching depth. Thus, it is possible to effectively reduce the possibilities of shorts occurring between the contact plugs and the gate. Moreover, since the etching width/height ratios are close to each other, the requirements on etching and the contact filling processes are relaxed. At the same time, the possibility of the occurrence of process defects is also reduced. Additionally, the present invention involves the replacement gate process which is compatible with the typical replacement gate procedures.

Next, by referring to FIGS. 2-14, the respective steps of the semiconductor device manufacturing method proposed by the present invention will be described in details.

Figure 2:
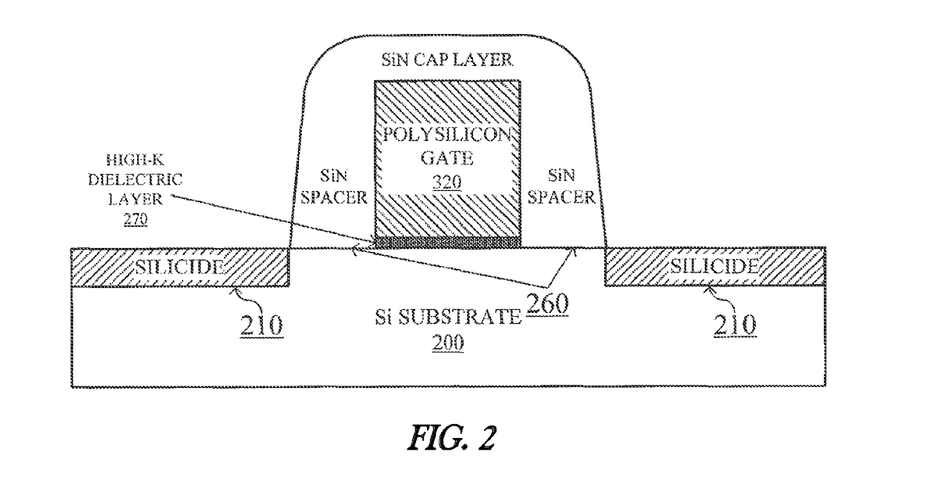

Firstly, as shown in FIG. 2, silicide regions 210 and a sacrificed gate structure (a high-k dielectric layer 270, a polysilicon gate 320, a SiN spacer 260 and SiN cap layer surrounding and covering the high-k dielectric layer 270 and the polysilicon gate 320) are formed on a Si substrate 200. As an example of the present invention, the high-k dielectric layer 270 has a thickness of 1-3 nm, the polysilicon gate 320 has a thickness of 20-70 nm, the SiN spacer 260 has a width of 10-40 nm in a horizontal direction of the drawing, and the SiN cap layer has a thickness of 15-40 nm. This step is also a part of the conventional process, but herein the polysilicon gate 320 is formed to be a sacrificed gate to be replaced a metal gate.

Figure 3:
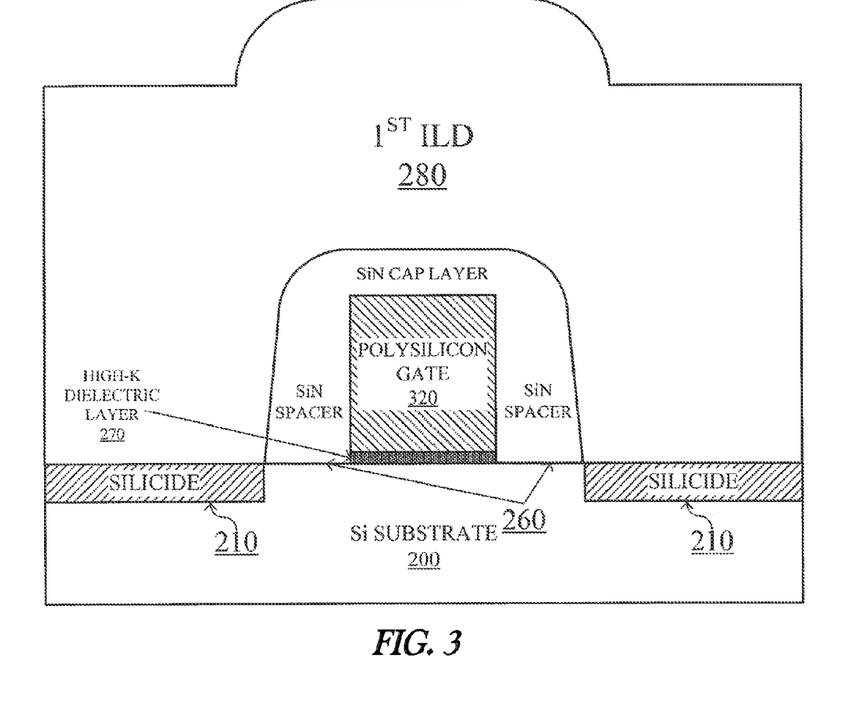

After the structure as shown in FIG. 2 is formed and before the step shown in FIG. 3 is performed, a barrier liner (e.g., consisting of $Si_3N_4$) (not shown) can be entirely formed on the structure as shown in FIG. 2, wherein the barrier liner has a width of 10-50 nm.

Then, as shown in FIG. 3, a first inter-layer dielectric layer 280 is deposited on the Si substrate 200 with the silicide regions 210 and the sacrificed gate structure formed thereon. For example, undoped silicon oxide ($SiO_2$), doped silicon oxide (e.g., Boro-Silicate Glass (BSG) and Boro-Phospho-Silicate Glass (BPSG)) and silicon nitride ($Si_3N_4$) and the like can be used as the material of the first inter-layer dielectric layer 280.

Figure 4:
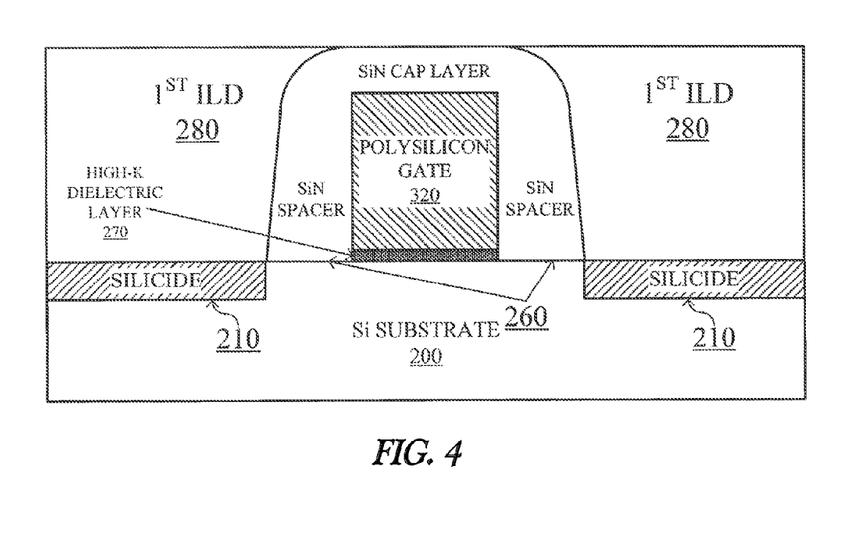

Next, as shown in FIG. 4, the Chemical Mechanical Planarization (CMP) process is performed on the first inter-layer dielectric layer 280 to expose the SiN cap layer of the sacrificed gate structure.

Figure 5:
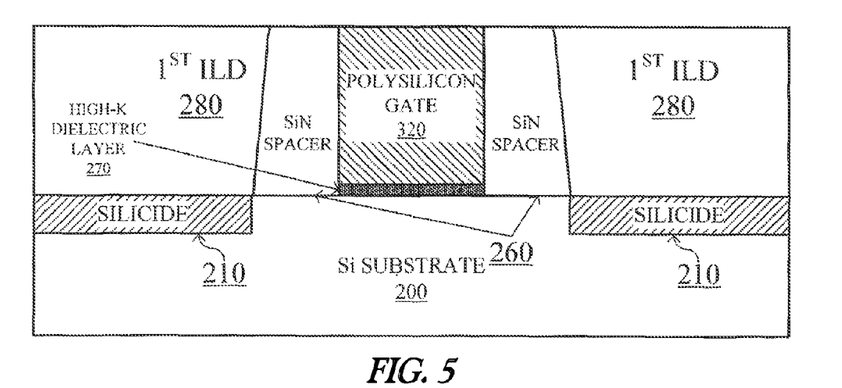

Then, as shown in FIG. 5, the SiN cap layer is removed by performing another CMP process or a Reactive Ion Etching (RIE) process for SiN to expose the polysilicon gate 320 of the sacrificed gate structure.

Figure 6:
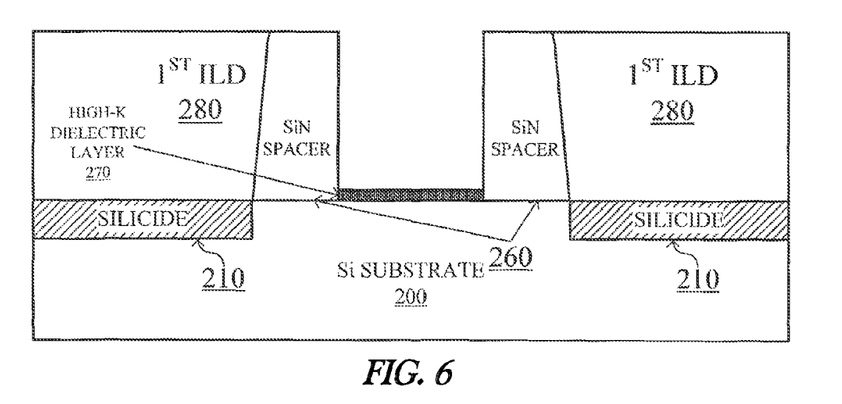

Thereafter, as shown in FIG. 6, the entire polysilicon gate 320 is completely removed by dry etching or wet etching to form an opening.

Figure 7:
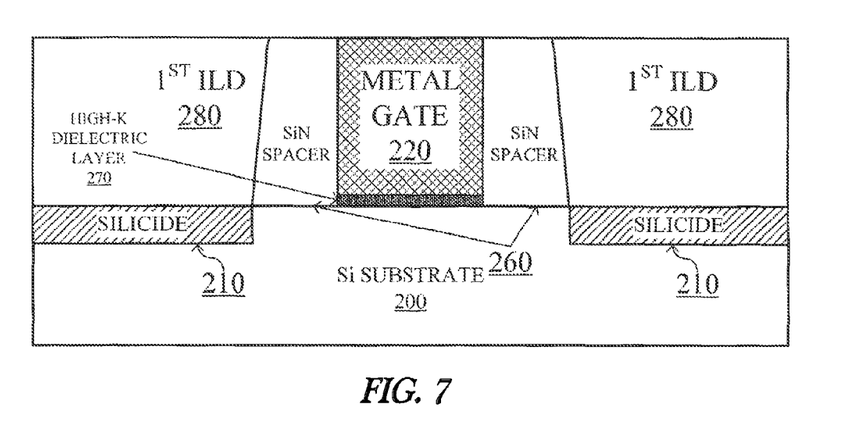

Next, as shown in FIG. 7, depositing metal gate material into the opening to form a metal gate 220 is deposited and formed by means of the typical replacement gate process. After this step, the polysilicon gate 320 as the sacrificed gate is completely substituted by the metal gate 220.

Figure 8:
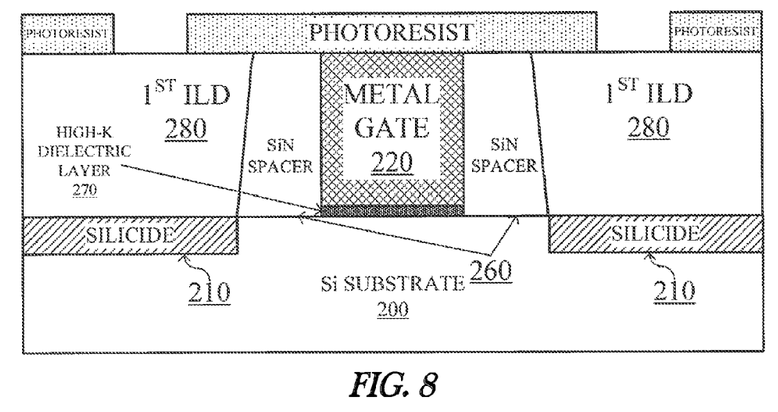
Figure 9:
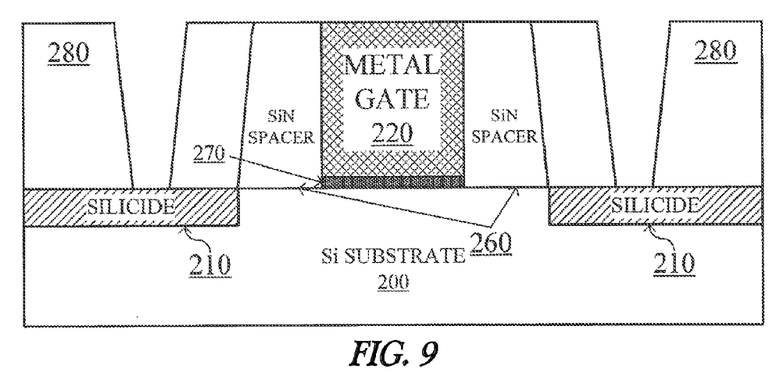

Then, as shown in FIGS. 8 and 9, by using lithography, a photoresist mask is formed (FIG. 8), and contact openings are formed at predetermined position in the first inter-layer dielectric layer 280 by etching and photoresist removal processes so that at the bottoms of the contact openings, the silicide regions 210 on the Si substrate 200 are exposed (FIG. 9). In a case where the barrier liner (not shown) is included, it is necessary to etch through the barrier liners on the silicide regions 210 at the bottoms of the contact openings so that the silicide regions 210 are exposed.

Figure 10:
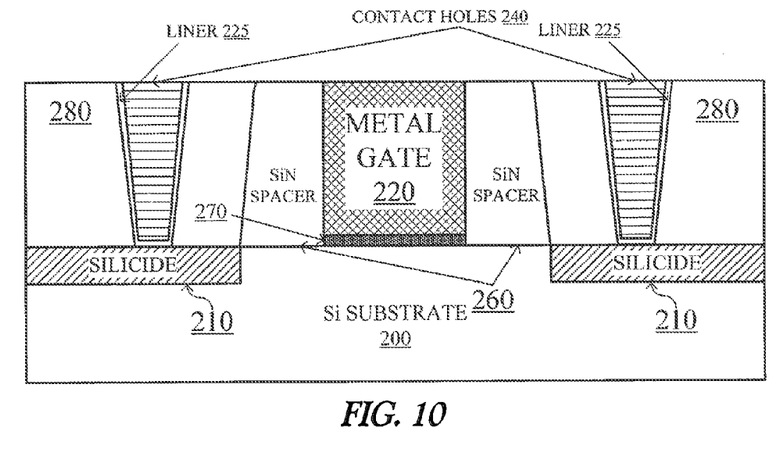

Thereafter, as shown in FIG. 10, metal plugs are deposited and formed in the contact openings so that first source/drain contact plugs 240 are formed and in contact with the respective silicide regions 210 thereunder. In this step, liners 225 (for example, TiN, TaN, Ta or Ti, and typically, having a width of approximate 2 nm-approximate 15 nm) are firstly deposited; conductive metal (for example, Ti, Al, TiAl, Cu, W) are secondly deposited; and finally, the CMP process for metal is performed. The forming process of the first source/drain contact plugs 240 is same with or similar to the conventional process. In the present invention, the first source/drain contact plugs 240 have a width (in a horizontal direction of the drawing) of 15-100 nm.

Figure 11:
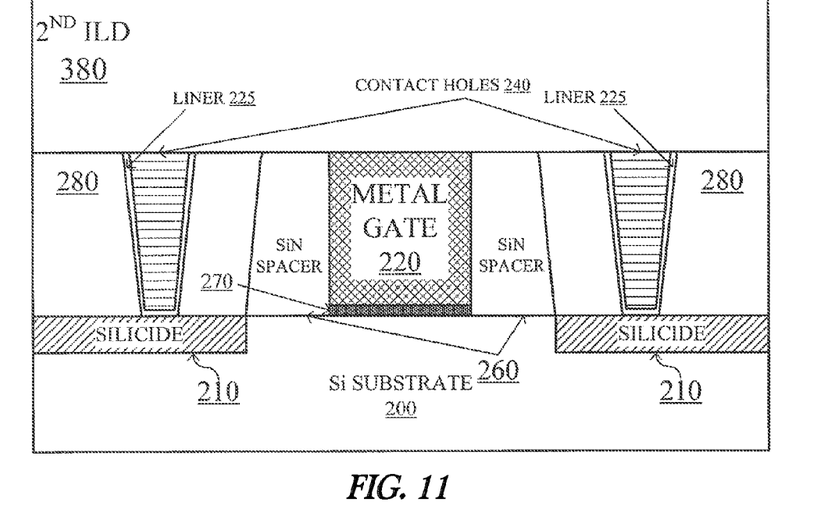

After the structure as shown in FIG. 10 is formed and before the step shown in FIG. 11 is performed, a barrier layer (e.g., consisting of $Si_3N_4$) (not shown) can be entirely formed on the structure as shown in FIG. 10, wherein the barrier layer has a width of 10-50 nm.

Next, as shown in FIG. 11, a second inter-layer dielectric layer 380 is deposited on the first inter-layer dielectric layer 280 with the first source/drain contact plugs 240 and the metal gate 220 formed therein. For example, undoped silicon oxide ($SiO_2$), doped silicon oxide (e.g., Boro-Silicate Glass (BSG) and Boro-Phospho-Silicate Glass (BPSG)) and silicon nitride ($Si_3N_4$) and the like can be used as the material of the second inter-layer dielectric layer 380. Because of the previous CMP process (FIG. 10), the second inter-layer dielectric layer 380 has a planar upper surface.

Figure 12:
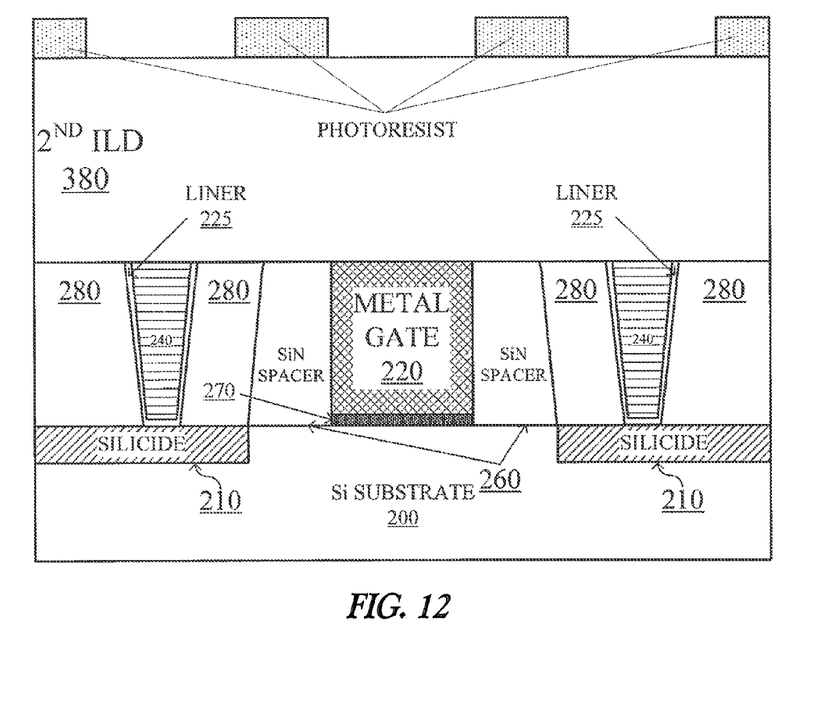
Figure 13:
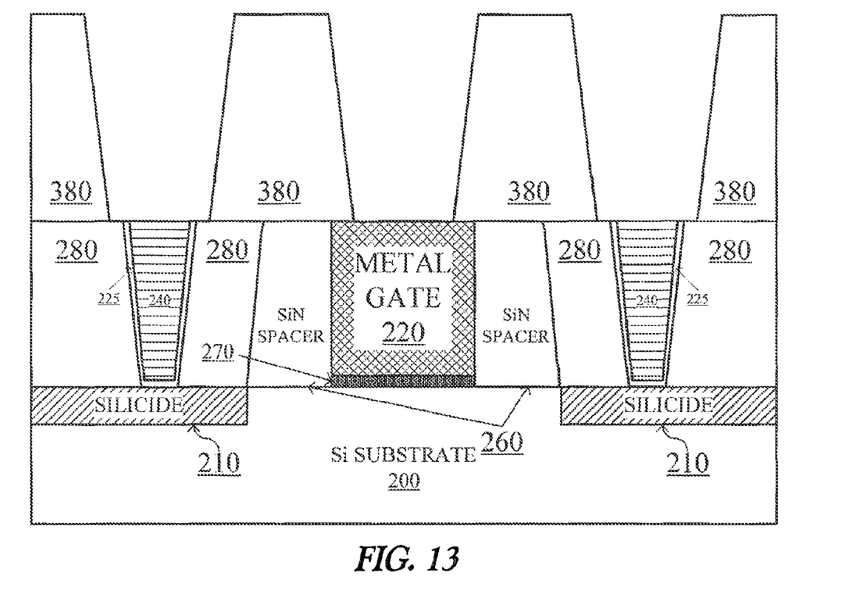

Then, as shown in FIGS. 12 and 13, by using lithography, a photoresist mask is formed (FIG. 12), and contact openings are formed at predetermined position in the second inter-layer dielectric layer 380 by etching and photoresist removal processes so that at the bottoms of the contact openings, the first source/drain contact plugs 240 and the metal gate 220 in the first inter-layer dielectric layer 280 are exposed (FIG. 13). In a case where the barrier layer (not shown) is included, it is necessary to etch through the barrier layers on the first source/drain contact plugs 240 and the metal gate 220 at the bottoms of the contact openings so that the first source/drain contact plugs 240 and the metal gate 220 are exposed.

Finally, as shown in FIG. 14, metal plugs are deposited and formed in the contact openings so that second source/drain contact plugs 340 and a gate contact plug 330 are formed, in which the second source/drain contact plugs 340 are in contact with the respective first source/drain contact plugs 240 thereunder, and the gate contact plug 330 is in contact with the metal gate 220. In this step, liners 325 (for example, TiN, TaN, Ta or Ti, and typically, having a width of approximate 2 nm-approximate 15 nm) are firstly deposited; conductive metal (for example, Ti, Al, TiAl, Cu, W) are secondly deposited; and finally, the CMP process for metal is performed. The forming process of the second source/drain contact plugs 340 and the gate contact plug 330 is same with or similar to the conventional process. In the present invention, the second source/drain contact plugs 340 have a width (in a horizontal direction of the drawing) of 20-150 nm, and the gate contact plug 330 has a width (in a horizontal direction of the drawing) of 20-150 nm.

Additionally, in the present invention, the conductive metals can be selected so that the conductive metal in the second source/drain contact plugs 340 and the gate contact plug 330 has a resistivity smaller than that of the conductive metal in the first source/drain contact plugs 240. For example, Cu can be selected as the conductive metal in the second source/drain contact plugs 340 and the gate contact plug 330, and Al can be selected as the conductive metal in the first source/drain contact plugs 240. Or, Al can be selected as the conductive metal in the second source/drain contact plugs 340 and the gate contact plug 330, and Ti can be selected as the conductive metal in the first source/drain contact plugs 240.

As such, the semiconductor device according to the present invention can be obtained. As aforementioned, the second source/drain contact plugs 340 and the gate contact plug 330 have the same etching depth. Thus, it is possible to effectively reduce the possibilities of shorts occurring between the contact plugs and the gate. Moreover, since the etching width/height ratios are close to each other, the requirements on etching and the contact filling processes are relaxed. At the same time, the possibility of the occurrence of process defects is also reduced.

Additionally, in the present invention, the first source/drain contact plugs 240 and the gate structure have the same height. Such a configuration makes the process of forming the first source/drain contact plugs 240 much easier. In this case, the lithography is completely performed on a planar surface. Moreover, such a configuration makes the present invention compatible with the standard replacement gate process.

The foregoing description gives only the preferred embodiments of the present invention and is not intended to limit the present invention in any way. Thus, any modification, substitution, improvement or like made within the spirit and principle of the present invention should be encompassed by the scope of the present invention.

What is claimed is:

1. A method of forming a dual contact plug, comprising steps of:
   forming a source/drain region and a replacement gate structure on a semiconductor substrate, the replacement gate structure including a replacement gate;
   depositing a first inter-layer dielectric layer;
   planarizing the first inter-layer dielectric layer to expose the replacement gate in the replacement gate structure;
   completely removing the entire replacement gate to form an opening and depositing metal gate material into the opening to form a metal gate by means of replacement gate process;
   etching to form a first source/drain contact opening in the first inter-layer dielectric layer by means of lithography so that the source/drain region formed on the semiconductor substrate is exposed at the bottom of the first source/drain contact opening;
   sequentially depositing a liner and filling conductive metal in the first source/drain contact opening to form a first source/drain contact plug;
   depositing a second inter-layer dielectric layer on the first inter-layer dielectric layer with the first source/drain contact plug formed therein;
   etching to form a second source/drain contact opening and a gate contact opening in the second inter-layer dielec-
   tric layer by means of lithography so that the first source/drain contact plug is exposed at the bottom of the second source/drain contact opening and the metal gate is exposed at the bottom of the gate contact opening; and
   sequentially depositing a liner and filling conductive metal in the second source/drain contact opening and the gate contact opening to form a second source/drain contact plug and a gate contact plug.

2. The method according to claim 1, wherein
   the width of the first source/drain contact plug is 15-100 nm,
   the width of the second source/drain contact plug is 20-150 nm, and
   the width of the gate contact plug is 20-150 nm.

3. The method according to claim 1, wherein
   the conductive metal in the second source/drain contact plug and the gate contact plug has a resistivity smaller than that of the conductive metal in the first source/drain contact plug.

4. The method according to claim 1, further comprising a step of:
   forming a barrier liner entirely on the semiconductor substrate with the source/drain region and the replacement gate structure formed thereon, before depositing the first inter-layer dielectric layer.

5. The method according to claim 4, wherein
   the barrier liner includes $Si_3N_4$ and has a thickness of 10-50 nm.

6. The method according to claim 1, further comprising a step of: forming a barrier layer entirely on the first inter-layer dielectric layer with the first source/drain contact plug formed therein, before depositing the second inter-layer dielectric layer.

7. The method according to claim 6, wherein
   the barrier layer includes $Si_3N_4$ and has a thickness of 10-50 nm.

8. The method according to claim 1, wherein
   the liner in the first source/drain contact opening and/or the liner in the second source/drain contact opening and the gate contact opening includes at least one selected from TiN, TaN, Ta and Ti, and
   the conductive metal in the first source/drain contact opening and/or the conductive metal in the second source/drain contact opening and the gate contact opening includes at least one selected from Ti, Al, TiAl, Cu and W.

9. The method according to claim 1, wherein
   the replacement gate is a polysilicon gate.

10. The method according to claim 1, wherein
   the thickness of the first inter-layer dielectric layer is 15-50 nm, and
   the thickness of the second inter-layer dielectric layer is 25-90 nm.

* * * * *